US006418071B2

(12) United States Patent
Beigel et al.

(10) Patent No.: US 6,418,071 B2
(45) Date of Patent: Jul. 9, 2002

(54) METHOD OF TESTING A MEMORY CELL

(75) Inventors: Kurt D. Beigel; Manny K. Ma, both of Boise; Gordon D. Roberts, Meridian; James E. Miller; Daryl L. Habersetzer, both of Boise; Jeffrey D. Bruce, Meridian; Eric T. Stubbs, Boise, all of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/735,329

(22) Filed: Dec. 11, 2000

Related U.S. Application Data

(60) Continuation of application No. 09/483,549, filed on Jan. 14, 2000, now Pat. No. 6,181,617, which is a continuation of application No. 09/260,232, filed on Mar. 1, 1999, now Pat. No. 6,028,799, which is a division of application No. 08/855,555, filed on May 13, 1997, now Pat. No. 5,877,993.

(51) Int. Cl.$^7$ .................................................. G11C 7/00
(52) U.S. Cl. ....................................... 365/201; 365/205
(58) Field of Search ................................. 365/201, 203, 365/205, 207, 208

(56) References Cited

U.S. PATENT DOCUMENTS

| | | | |
|---|---|---|---|
| 5,042,011 A | 8/1991 | Casper et al. ............... 365/205 |
| 5,175,450 A | 12/1992 | Chern ......................... 307/530 |
| 5,297,087 A | 3/1994 | Porter ......................... 365/201 |
| 5,339,273 A | 8/1994 | Taguchi ....................... 365/201 |
| 5,339,277 A | 8/1994 | McClure ................ 365/230.08 |
| 5,341,366 A | 8/1994 | McClure ..................... 365/201 |
| 5,343,433 A | 8/1994 | Duvvury et al. ............. 365/205 |
| 5,388,077 A | 2/1995 | Sanada ........................ 365/201 |
| 5,469,393 A | 11/1995 | Thomann ..................... 365/201 |
| 5,500,824 A | 3/1996 | Fink ............................. 365/201 |
| 5,544,108 A | 8/1996 | Thomann ..................... 365/201 |
| 5,561,635 A | 10/1996 | Tada et al. ................... 365/201 |
| 5,577,051 A | 11/1996 | McClure ..................... 371/21.4 |
| 5,604,704 A | 2/1997 | Atsumo ....................... 365/203 |
| 5,629,943 A | 5/1997 | McClure ..................... 371/21.1 |
| 5,646,880 A | 7/1997 | Yuh .............................. 365/149 |
| 5,687,178 A | 11/1997 | Herr et al. ................... 371/21.4 |
| 5,689,467 A | 11/1997 | Hashimoto .................. 365/201 |
| 5,694,364 A | 12/1997 | Morishita et al. ........... 365/201 |
| 5,748,544 A | 5/1998 | Hashimoto .................. 365/201 |
| 5,768,200 A | 6/1998 | Liu et al. ..................... 365/203 |

*Primary Examiner*—Vu A. Le
(74) *Attorney, Agent, or Firm*—Charles Brantley

(57) ABSTRACT

As part of a memory array, a circuit is provided for altering the drive applied to an access transistor that regulates electrical communication within the memory array. In one embodiment, the circuit is used to alter the drive applied to a sense amp's voltage-pulling transistor, thereby allowing modification of the voltage-pulling rate for components of the sense amp. A sample of test data is written to the memory array and read several times at varying drive rates in order to determine the sense amp's ability to accommodate external circuitry. In another embodiment, the circuit is used to alter the drive applied to a bleeder device that regulates communication between the digit lines of the memory array and its cell plate. Slowing said communication allows defects within the memory array to have a more pronounced effect and hence increases the chances of finding such defects during testing. The circuit is configured to accept and apply a plurality of voltages, either through a contact pad or from a series of discrete voltage sources coupled to the circuit.

2 Claims, 9 Drawing Sheets

METHOD OF TESTING A MEMORY CELL

RELATED APPLICATIONS

This application is a continuation of U.S. application Ser. No. 09/483,549, filed Jan. 14, 2000 now U.S. Pat. No. 6,181,617; which is a continuation of U.S. application Ser. No. 09/260,232, filed Mar. 1, 1999 and issued as U.S. Pat. No. 6,028,799; which is a divisional of U.S. application Ser. No. 08/855,555, filed May 13, 1997 and issued as U.S. Pat. No. 5,877,993.

TECHNICAL FIELD

The present invention relates generally to semiconductor circuit devices and, more specifically, to a circuit for changing the voltage applied to selective portions of a memory array. Such portions include digit line pairs as well as the gate of a transistor used to regulate sense amplifiers.

BACKGROUND OF THE INVENTION

In the operation of certain semiconductor circuit devices, pullup and pulldown sense amplifiers (sense amps) detect and amplify a small charge stored within a memory cell. In general, two complementary digit lines are attached to a pullup sense amp and a pull down sense amp. At the beginning of a reading operation, both lines are at an equilibrate voltage Veq, which is generally between the potential of a voltage source used to operate the semiconductor device ($V_{CC}$) and ground potential (0 volts). While Veq is changeable either intentionally or inadvertently through a defect, Veq is ideally equal to $V_{CC}/2$ during non-test operations. This midpoint voltage is defined as $DVC_2$.

One of the digit lines is coupled to a memory cell. The reading process involves a discharge from the memory cell to the corresponding digit line, which creates a slight difference in voltage between the two digit lines. This difference is then amplified by the sense amps: the digit line with the slightly lower voltage has its voltage further decreased by the pulldown sense amp, and the voltage of the other digit line is increased by the pullup sense amp. Once the voltage difference has been amplified, the digit lines can then be used to operate less sensitive circuitry.

Between reading cycles, it is necessary to return the complementary digit lines to Veq. This occurs during what is known as a precharge cycle, wherein equilibration transistors short the complementary digit lines together. Further, a signal having a potential of $DVC_2$ is communicated from a $DVC_2$ voltage generator to the shorted digit lines through a bleeder device.

Concerning the operation of the sense amps, it should be noted that pulling down the voltage of a digit line involves coupling the line to ground through a pulldown transistor. Because an entire row of digit line pairs often connects to the same pulldown transistor through a common node, the pulldown transistor will most likely have to draw current from one line of each of several pairs. In doing so, there is a risk that the transistor will become saturated with current and therefore become slower in pulling down the voltage of additional digit lines. This may lead to errors in reading, especially if an entire row of memory cells is storing logic 1's except for one cell storing a logic 0; for once the logic 0 is discharged, a slow pulldown may result in an improper reading of that logic 0 value.

One known way to solve this problem is to include an optional active area in the gate of the pulldown transistor. The increased size of the gate raises the threshold at which the pulldown transistor becomes saturated. However, one of ordinary skill in the art will appreciate that this solution requires a costly metal mask change. Further, any attempt to speed up the slowed pulldown raises other problems in reading, as disclosed in U.S. Pat. No. 5,042,011, by Casper, et al. The Casper '011 reference discloses that pulling down the common node too quickly may result in capacitive coupling between the sources and drains of the sense amp's transistors. During capacitive coupling, both digit lines in one sense amp are pulled down before the common node is pulled down low enough to turn on one of the sense amp transistors. When the sense amp finally turns on, it shorts out the capacitive coupling, bouncing the digit lines and, in the process, creates line noise that will interfere with the ability to read the data properly.

Early saturation and capacitive coupling could be avoided if one knew the margin—the difference in voltage between a logic 0 signal and a logic 1 signal—that the pulldown transistor was capable of accommodating. The only way to do so, as taught by the prior art, is to separate the pulldown transistor with a laser and probe the gate.

As an alternative to determining the sense amp's margin, one could simply test the sense amp's ability to operate at the given source voltage used in non-test operations. Prior art suggests entering a series of test data patterns into memory. Logic 1's are written to the cells of each memory array, with the exception of one column of logic 0's. As a result, each row contains only one cell storing a logic 0, thereby creating the most likely circumstance for an error in reading the data. The data in the array is then read and checked for errors. Once the first group of test data has been processed, a second sample of test data is entered with the logic 0's written to the next column. This process repeats until a logic 0 has been written to and read from every cell in any given row in the memory array. The results will indicate the pulldown transistor's ability to read data accurately. The problem with this process, however, is that it is time consuming to enter multiple samples of test data.

Thus, there is a need in the art for a quicker circuit and method for testing the capabilities of a sense amp. Further benefit would be derived if this test could indicate the margin of the sense amp's pulldown transistor.

In addition to inadequate pulldown transistors, other problems, such as defects arising during the processing of semiconductor devices, may contribute to reading errors. Various techniques involving equilibration of the complementary digit lines can be used during testing to detect these problems. For example, occasionally a digit line will inadvertently have a short to ground. As a result, the potential of that digit line will leak towards 0 volts. To detect this problem, prior art teaches extending the time for the precharge cycle during a test mode. If the short has a low enough resistance, the short will overcome the charging ability of the $DVC_2$ voltage generator, which remains coupled to the digit lines, and Veq of the digit lines will decrease. Thus, a longer precharge cycle allows Veq to lower even further. As a result, line noise is more likely to register as a logic 0 discharge on the digit line when in fact the storage cell contains a logic 1 and has not yet discharged. Alternatively, assuming that a logic 1 is properly discharged and sensed, a reading error is still likely: Veq may be so low due to the short that the pullup sense amp may not be able to pull up the digit line's voltage in time to register as a logic 1 for purposes of driving external circuitry. Increasing the likelihood of error is desirable in the test mode, as it helps to identify errors that would affect non-test operations.

Further, a reading error occurring after this extended precharge cycle will indicate the nature of the defect—in this case a short in at least one of the digit lines. However, this testing process can be time consuming. As an example, a 64 meg DRAM having a 16 meg×4 configuration requires approximately 170 seconds to carry out this test. It would be a benefit to the art to have a faster way to test for this problem.

A second problem that could be detected by altering the equilibration rate of the digit lines involves a short between the cell plate and the digit line. The typical technique for discovering this problem is to initiate a long RAS (Row Address Strobe) low signal. During the low RAS, the digit lines are not equilibrated. Rather, they are charged to their complementary voltage levels. Ideally, once the low RAS ends and the lines are shorted, both digit lines should approach a Veq level of $DVC_2$. However, a short between one of the digit lines and the cell plate will allow the $DVC_2$ generator 68 to change that digit line's voltage during the RAS low period. Thus, once the lines are shorted, their respective voltages will meet at a different Veq level. This will affect the margin between Veq and the voltage corresponding to one of the logic values and thereby increase the likelihood of a reading error. Eventually, the signal from the $DVC_2$ voltage generator will restore the proper equilibrate voltage once the RAS low signal ends. Nevertheless, for purposes of detecting this problem before non-test operations begin, it would be desirable to slow the restoration of the proper Veq level.

A third example concerns a defect that could exist within the memory cell's storage capacitor, such as a defect in a nitride layer acting as a dielectric between the memory cell's conductive plates. Such a defect could cause a short within the storage capacitor. Because the storage capacitors are coupled to the $DVC_2$ voltage generator, a defective capacitor "storing" a 0 volt charge, representing a logic 0, will slowly charge to the $DVC_2$ level. The closer the storage capacitor approaches a $DVC_2$ charge, the more likely that a logic 1 value may be misread during the next reading. One way to detect this problem in the prior art is to initiate a static refresh pause, wherein the memory cell's access transistor remains deactivated for a longer time than usual—generally 100 milliseconds. As a result, the capacitor, which should be storing a logic 0, has a longer time to charge to a higher voltage, thereby making an error in the next reading cycle more likely.

Once again, a speedier test is desired. The defect might be detected earlier if the problem were exacerbated to the point where the leaked charge for the stored logic 0 exceeded the equilibrate charge of the digit lines. As a result, a logic 1 would be read from the cell even though it was known that a logic 0 had been written. One could speed up the leakage into the storage capacitor by forcing $DVC_2$ to a higher voltage. However, the equilibrate voltage of the digit lines would also increase accordingly and remain higher than the voltage of the charge in the storage capacitor. Thus, forcing $DVC_2$ would not appreciably increase the ability to detect an error unless the equilibration of the digit lines could be slowed. The only way to do this in the prior art is through the use of a costly metal option to change the gate voltage of the bleeder device.

SUMMARY OF THE INVENTION

Given the need for regulating the drive of a sense amp, as well as the need for regulating the equilibration signal from a $DVC_2$ voltage generator, a test circuit is provided for varying the voltage of a signal used to drive a connection device that allows electrical communication within a semiconductor circuit. One preferred circuit embodiment includes a contact pad for carrying a range of test voltage signals to said connection device. In another preferred circuit embodiment, a regulator circuit enables a series of discrete voltages to drive the connection device.

In one set of applications involving the regulation of a sense amp, the connection device comprises a sense amp's voltage pulling transistor. Any circuit embodiment covered by the present invention can be used to test drive the transistor. In a preferred method of use, a test data pattern is entered and the data is read several times, with a different voltage driving the sense amp's pulldown transistor each time. One advantage of this preferred method is that it reduces the need for entering several elaborate test data patterns and, therefore, allows for quicker testing of memory arrays. A second advantage is that the embodied method and devices allow a determination of the lowest supply voltage that can be used during normal operation without errors in reading data. Yet another advantage is the ability to determine the highest supply voltage, and therefore the fastest reading speed, that can be used during normal operations without causing capacitive coupling. In doing so, the preferred circuit embodiments and method increase the sense amp's ability to distinguish between a logic 0 voltage and a logic 1 voltage without physically altering the sense amp. Further, in the process of determining the lowest and highest voltages at which the sense amp is capable of functioning, the preferred embodiments and method also provide a way to ascertain the margin without dissecting components of the sense amp.

Concerning the specific errors that may be detected in relation to equilibrating the digit lines, the connection device comprises an isolation bleeder device coupled between the $DVC_2$ voltage generator and a digit line pair. The circuit embodiments provide a test mode apparatus for driving the bleeder device in order to slow or quicken the equilibration of the digit line pair. Applying these embodiments provides the advantage of a quicker detection of defects such as a short from a digit line to ground, a short from a digit line to a cell plate, and a short within the storage capacitor of a memory cell. The embodiments also provide an alternative advantage of overcoming the influence of these defects during non-test modes.

BRIEF DESCRIPTION OF THE DRAWINGS

FIG. 1 also shows a digit line equilibration circuit as found in the prior art.

FIG. 2 also demonstrates the resulting amplification of the difference in voltage.

FIG. 7a further depicts a first type of possible defect within said memory array.

DETAILED DESCRIPTION OF THE PREFERRED EMBODIMENTS

Figure 1:
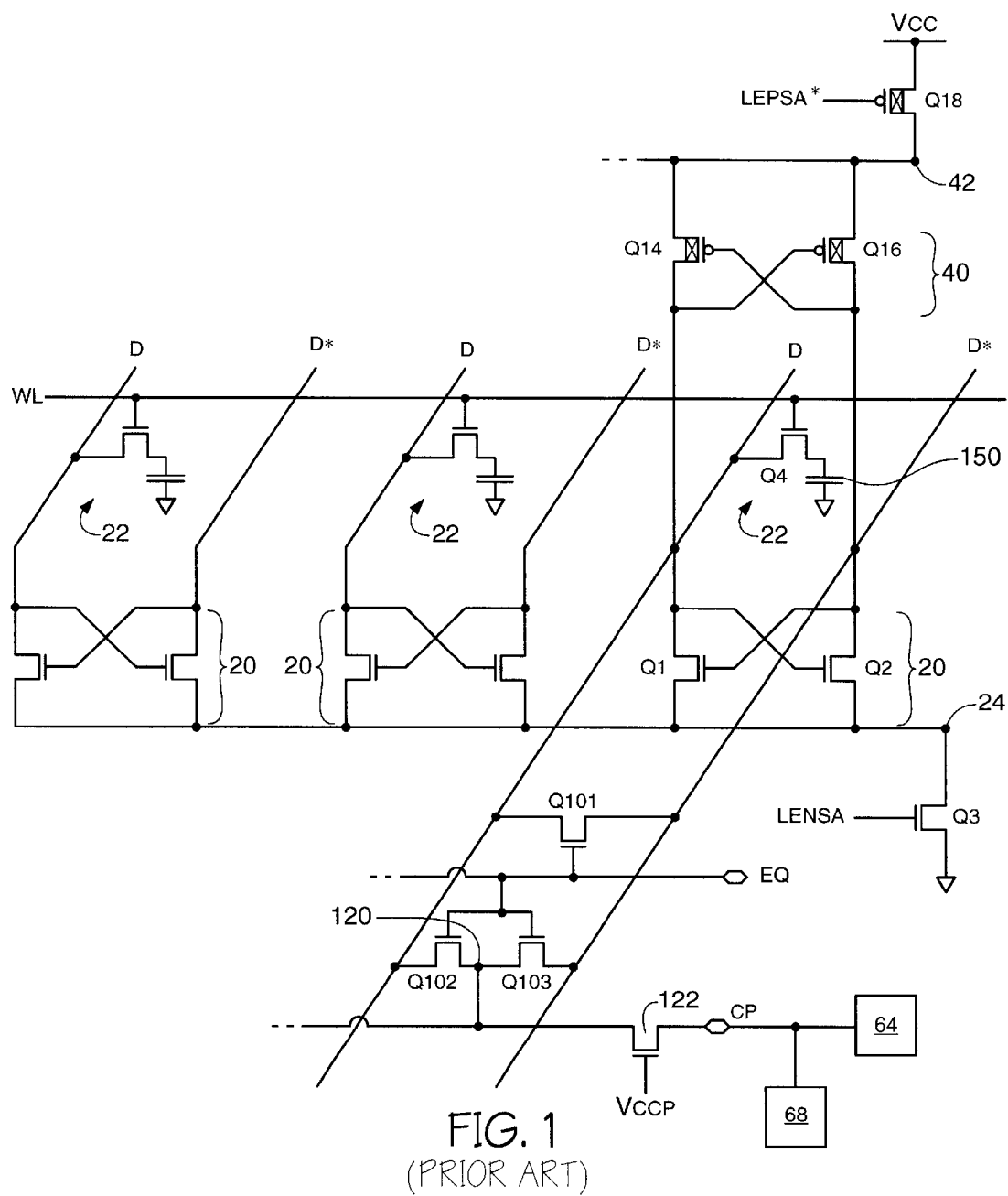
FIG. 1 depicts a row of n-channel pulldown sense amps with associated D, D*, and WL lines; a pullup sense amp; and a series of memory cells, as found in the prior art.

FIG. 1 illustrates the general configuration of sense amps in a memory array. A pulldown sense amp 20 includes cross coupled n-channel transistors Q1 and Q2, as well as a pulldown transistor Q3, which is an n-channel transistor driven by a signal designated as LENSA. These elements play a part in sensing and amplifying a voltage difference between D and D* caused by shorting a memory cell 22 to D by way of access transistor Q4. The sources of Q1 and Q2 are connected to a common pulldown node 24, and the gate of each is connected to the other's drain. The gate of Q1 also connects to the line D*, whereas the gate of Q2 connects to the line D.

As discussed above, each line D and its corresponding line D* are initially at the same voltage $DVC_2$. For purposes of explanation, $DVC_2$ is assumed to be 1.65 volts, or one half of the source voltage $V_{CC}$, which is 3.3 volts. Lines D and D* connect to opposite sides of each sense amp 20. Common pulldown nodes 24 found in the sense amp arrays will also be at $DVC_2$. A signal sent through the path WL will cause a storage capacitor 150 of particular memory cell 22 to discharge to a line D, thereby slightly changing D's voltage while the voltage of D* remains at $DVC_2$. Again, for purposes of explanation, a memory cell discharge will be assumed to cause a 0.2 volt difference in D. The pulldown sense amp 20 will then turn on when the common pulldown node 24 is one transistor threshold voltage below D or D*, whichever is highest. For instance, if a memory cell 22 is storing a logic 1, a discharge to D will increase D's voltage to 1.85 volts. As a result, the pulldown sense amp transistor gated by D (Q2) turns on faster than the one gated by D* (Q1). With transistor Q2 on, D*'s voltage is pulled down from 1.65 volts towards ground as the common pulldown node 24 is pulled down as well. Further, the lowering voltage of D* serves to turn on the pullup sense amp transistor gated by D* (Q14) before the other pullup sense amp transistor turns on. The voltage supply $V_{CC}$ then charges line D.

On the other hand, if the memory cell 22 had been storing a logic 0, then a discharge to D would slightly lower D's voltage to 1.45 volts. The pulldown sense amp transistor gated by D* (Q1) would turn on first and D's voltage would be further decreased toward ground by the pulldown sense amp, thereby allowing the pullup sense amp to increase D*'s voltage toward $V_{CC}$. In this way, a small voltage difference between D and D* is sensed and amplified. Once the voltage difference has been amplified, D and D* can drive less sensitive circuitry not shown in FIG. 1. It should be noted that, if a logic 0 is transmitted to D, then the pulldown sense amp need only pull down D from 1.45 volts. If a logic 1 is transmitted to D, then the pulldown sense amp must pull D* from the higher $DVC_2$ level—1.65 volts.

Figure 2:
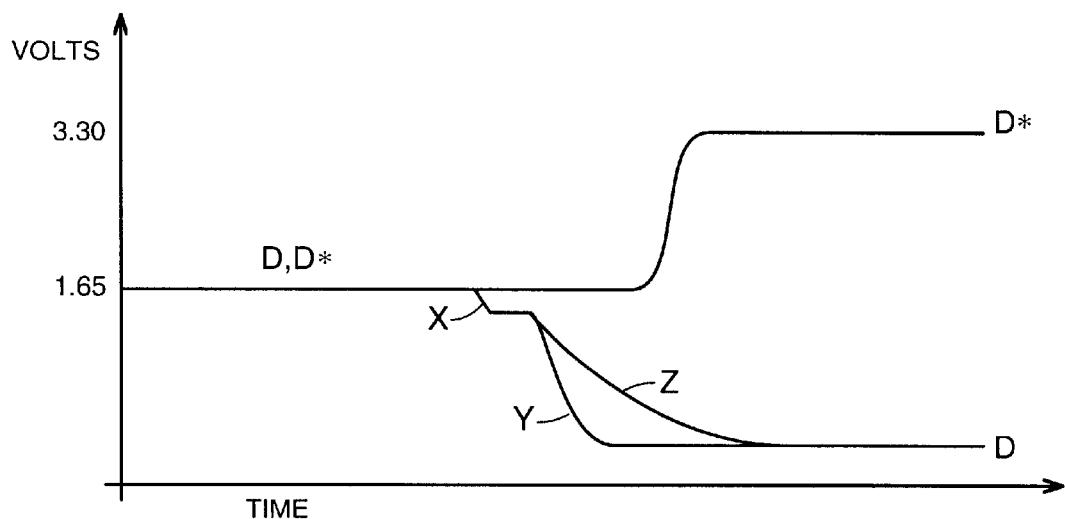
FIG. 2 is a graph indicating the voltage of the conductive paths D and D* over time in the event that a memory cell storing a logic 0 discharges to D.

Therefore, if many logic 1's in a memory array row are read, the extra voltage that must be pulled contributes to saturating the pulldown transistor Q3 with drive current, thereby slowing any further pulldown. The problem created by slow pulldown is illustrated in FIG. 2, where slope X denotes the initial discharge to D from a memory cell 22 storing a logic 0. FIG. 2 further illustrates the amplification of the difference in voltage between D and D*. Slope Y denotes the time required for D to drop in voltage given a situation where a row of cells contains a roughly equal number of logic 1's and logic 0's. Should there be many logic 1's read amongst a single logic 0, then the outcome changes: as the logic 0 is read, the pulldown transistor Q3, having approached saturation, takes much longer to pull down D's voltage. This result is illustrated by slope Z. Other circuitry elements (not shown) that are driven by D may read D before its transition to a lower voltage has been completed. As a result, a logic 0 value may be misread as a logic 1.

Figure 3:
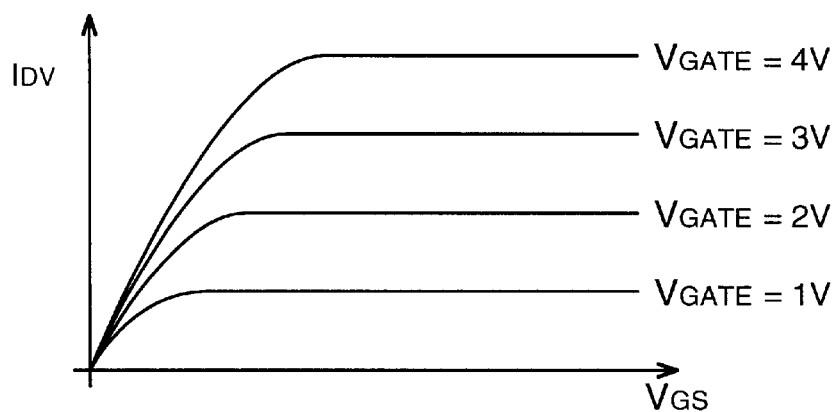
FIG. 3 is a graph demonstrating the relationship between drive current ($I_{DV}$) and the gate-source voltage of a pulldown transistor ($V_{GS}$) at various levels of voltage applied to the gate ($V_{GATE}$).

As illustrated in FIG. 3, increasing the voltage to the gate of the pulldown transistor allows the transistor to pulldown more current before saturation. One preferred embodiment of the current invention that uses this principal is detailed in FIG. 4, where the pulldown transistor Q3 is driven by a test circuit 26 through an inverter 27. In this embodiment, the inverter 27 comprises a p-channel transistor Q6 and an n-channel transistor Q8. The coupled gates of inverter transistors Q6 and Q8 form an input node 28 for receiving a signal ENSA*, which may be $V_{CC}$, ground, or a signal from another driver. The coupled drains of the inverter transistors Q6 and Q8 output the LENSA signal that drives the pulldown transistor Q3. The source of Q8 is coupled to ground. The source of Q6 is coupled to a source node 30 that branches into a first conducting path 32 and a second conducting path 34. The first conducting path 32 is coupled to an n-channel transistor Q10, which has a channel width-to-length ratio of around 500/2. The drain of transistor Q10 is coupled to a contact pad 36. It should be understood that the term "contact pad" includes any conductive surface configured to permit electrical communication with a circuit or a node. The gate of transistor Q10 is coupled to an inverter 60 through another n-channel transistor Q36. Together, inverter 60 and transistor Q36 comprise a latch device, and both are coupled to $V_{CCP}$. Further, inverter 60 receives a TEST* signal as an input. In addition, the gate of transistor Q10 is also coupled to a feedback capacitor 62.

This feedback capacitor 62 comprises an n-channel transistor having a size of approximately 100/100, wherein the drain and source are shorted and coupled to the first conductive path 32. The second conducting path 34 is coupled to a p-channel transistor Q12, driven by a signal TEST, which is understood to be the complement of TEST*. The transistor Q12 is also coupled to $V_{CC}$, although no voltage source is considered to be a part of the invention.

During testing, TEST* transmits a low voltage signal which is received by the inverter 60. In response, the inverter 60 initiates a $V_{CCP}$ signal, sending it through transistor Q36 which outputs the $V_{CCP}$ signal to the gate of transistor Q10, thereby switching on Q10. The feedback capacitor 62 serves to maintain and replenish this $V_{CCP}$ signal in the event of leakage. Capacitive coupling between the gate and drain of transistor Q10 allows Q10 to carry signals having a range of voltages for modifying the drive of the pulldown transistor Q3. Simultaneously, the TEST signal, applying a high voltage to transistor Q12, isolates $V_{CC}$. A test data pattern is entered into the memory cells 22 and read with varying voltages driving the pulldown transistor Q3. The data read at various alternate voltages sent through bond pad 36 can be compared with the data as originally written. This series of readings indicates the range of voltages through which the pulldown transistor Q3 is capable of allowing accurate data readings. Once testing has ended, TEST* sends a high voltage signal and TEST becomes low, thereby isolating the bond pad and allowing the $V_{CC}$ signal to transmit to the pulldown transistor Q3.

Figure 4:
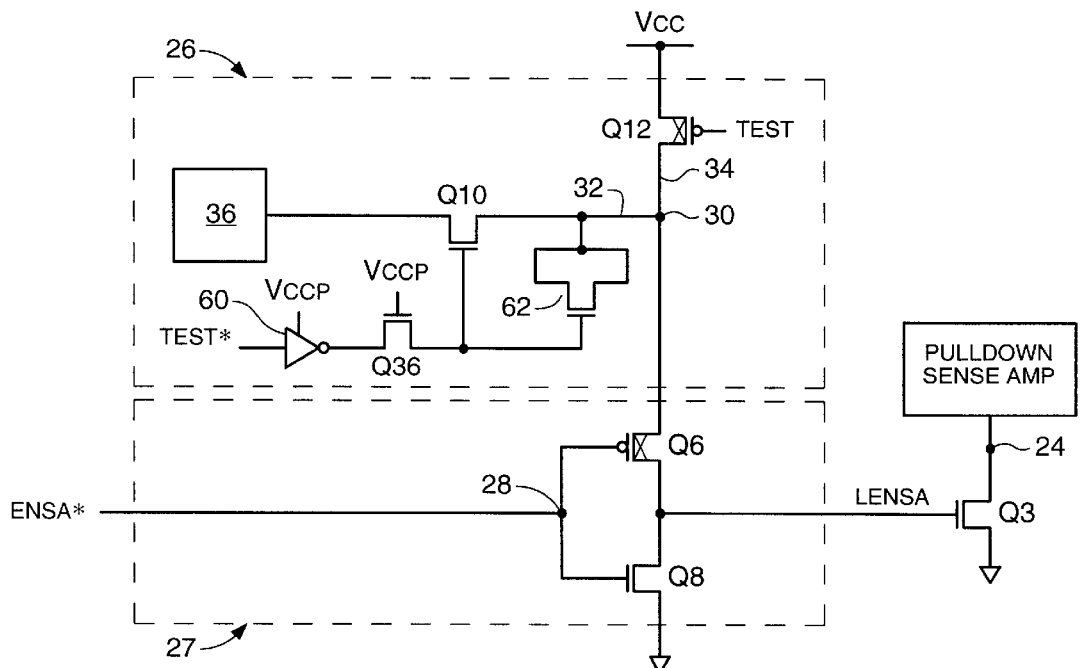
FIG. 4 details one exemplary circuit embodiment in accordance with the present invention as used with a sense amp.
Figure 5:
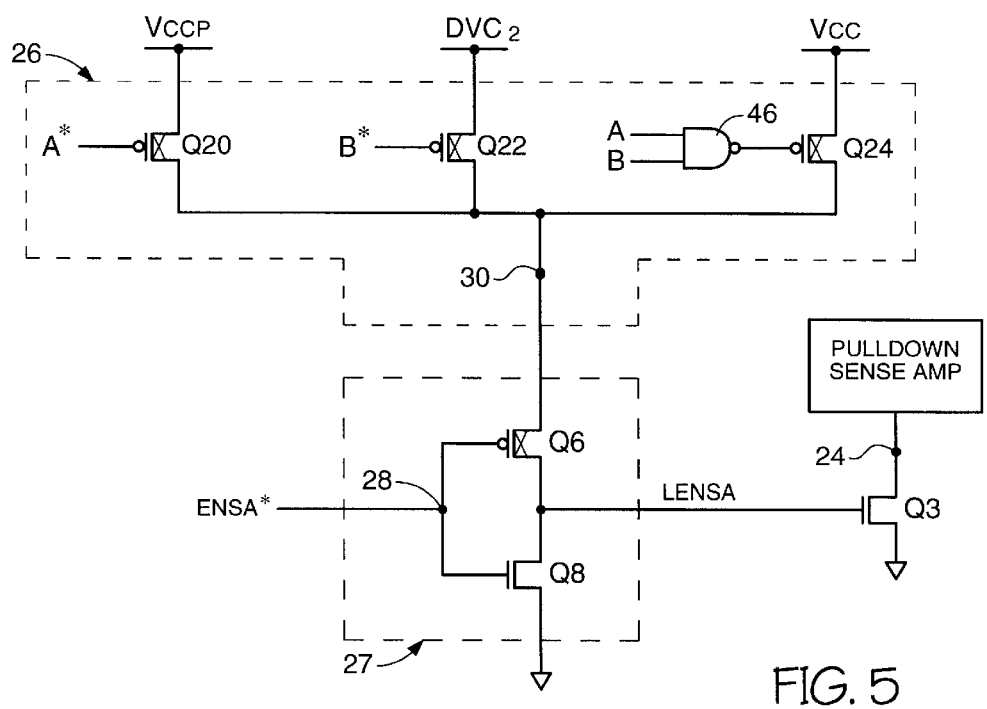
FIG. 5 illustrates a second exemplary circuit embodiment in accordance with the present invention as used with a sense amp.

The embodiment illustrated in FIG. 5 is a package part of the semiconductor circuit device and receives a plurality of voltage sources with different magnitudes. The test circuit 26 allows selection among these sources for driving the gate of the pulldown transistor Q3. The inverter 27 is the same as in FIG. 4. In this exemplary embodiment, however, source node 30 is coupled to three discrete voltage sources. First, source node 30 is coupled to $V_{CCP}$ through a p-channel transistor Q20 that is driven by a low signal A*. Source node 30 is also coupled to $DVC_2$ through another p-channel transistor Q22 that is driven by a low signal B*. Finally, source node 30 is coupled to $V_{CC}$ by way of a p-channel transistor Q24. This p-channel transistor Q24 is gated by the output of a logic unit, such as a NAND gate 46, which will drive transistor Q24 in response to receiving a high signal A as a first input and a high signal B as a second input. Given the input vector scheme of this embodiment, one of the transistors Q20, Q22, or Q24 will be operable to the exclusion of the other two.

Thus, a low signal A* will drive the p-channel transistor Q20, thereby allowing $V_{CCP}$ to drive the pulldown transistor Q3. Simultaneously, signal B will be high, turning off p-channel transistor Q22. Further, the NAND gate output will also be high and turn off p-channel transistor Q24. If, on the other hand, signal B is low and signal A is high, then only p-channel transistor Q22 will be on, allowing $DVC_2$ to transmit to the pulldown transistor Q3. Only when both signals A and B are high does the NAND gate 46 output a low signal and allow $V_{CC}$ drive the pulldown transistor Q3. The data read at these three voltage levels can then be compared with the data as originally written. It should be noted that this configuration does not require the die space needed for the contact pad 36.

Figure 6:
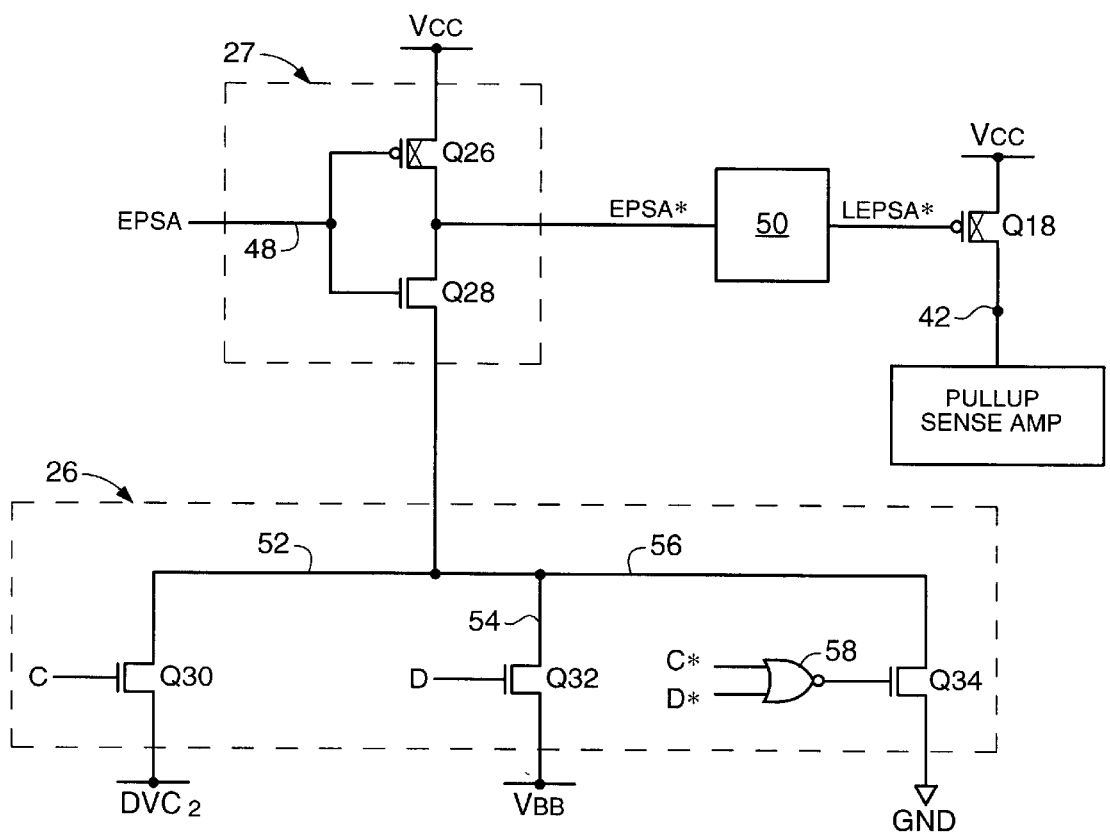
FIG. 6 shows a third exemplary circuit embodiment in accordance with the present invention as used with a sense amp.

Another embodiment concerns varying the voltage applied to a pullup sense amp 40. As seen in FIG. 1, the pullup sense amp 40 includes cross coupled p-channel transistors Q14 and Q16 as well as a pullup transistor Q18. As one of ordinary skill in the art understands, there is generally a pullup sense amp 40 corresponding to every pulldown sense amp. Nevertheless, for purposes of clarity, only one pullup sense amp 40 is shown. The sources of Q14 and Q16 are connected to a common pullup node 42, and the gate of each is connected to the other's drain. Further, the gate of Q14 connects to line D*, and the gate of Q16 connects to line D. Common pullup node 42 is coupled with pullup transistor Q18, which is another p-channel transistor. Pullup transistor Q18 is also coupled to the voltage source $V_{CC}$. The pullup transistor Q18 is driven by a signal LEPSA*. FIG. 6 illustrates that the voltage driving pullup transistor Q18 may also be varied through the use of a test circuit 26 analogous to that used with the pulldown transistor Q3 in FIG. 5. FIG. 6 depicts an inverter 27 comprising a p-channel transistor Q26 and an n-channel transistor Q28. The coupled gates of inverter transistors Q26 and Q28 form an input pathway 48 for a control signal designated EPSA. The coupled drains transmit the inverted output signal EPSA* which, in turn, is received by a prior art device 50 that outputs the LEPSA* signal used to drive the pullup transistor Q18. The source of Q26 is coupled to $V_{CC}$, whereas the source of Q28 is coupled to the test circuit 26 which, in this embodiment, includes three conductive paths. The first path 52 leads to $DVC_2$ by way of an n-channel transistor Q30, which is driven by a signal C. The second path 54 is coupled to a voltage source $V_{BB}$ through an n-channel transistor Q32, as driven by a signal D. The third path 56 leads to ground by way of n-channel transistor Q34. The gate of n-channel transistor Q34 is coupled to the output of a NOR gate 58. The NOR gate 58 accepts signal C as a first input and signal D as a second input and will activate transistor Q34 only when both signals are low. Further, this embodiment is configured in a manner analogous to the embodiment in FIG. 5, in that signals C and D will never simultaneously activate their respective transistors Q30 and Q32.

The three n-channel transistors Q30, Q32, and Q34 will turn on if a high, or logic 1, signal is transmitted to their respective gates. As with the embodiment shown in FIG. 5 for the pulldown sense amp, the signals and transistors are configured to allow only selective communication between one voltage source and the pullup transistor Q18. As a result, if signal C is high, it will latch the n-channel transistor Q30 and provide electrical communication between $DVC_2$ and the pullup transistor Q18. At the same time, the low signal from D turns off n-channel transistor Q32. Under these circumstances, the signals C and D also result in a low signal output from the NOR gate 58, thereby turning off n-channel transistor Q34. Thus, all of the other voltage sources are isolated. Similarly, if signal D is high, then only n-channel transistor Q32 is turned on and $V_{BB}$ electrically communicates with pullup transistor Q18. When both signals are low, the NOR gate 58 outputs a high signal, thereby grounding the source of the n-channel inverter transistor Q28. This embodiment has benefits similar to the embodiment in FIG. 5.

Returning to FIG. 1, a prior art equilibration circuit can be seen as part of the memory device. For purposes of explaining the following embodiments of this invention, $V_{CC}$ is now presumed to be 5 volts. A transistor Q101 is coupled between digit line D and its complementary digit line D*. The transistor is driven by an equilibration signal EQ. It should be noted that the signal EQ results from a logic function and is distinguishable from the equilibrate voltage Veq, which represents the common mid-range voltage level of the complementary digit lines before a reading operation.

The signal EQ also drives two additional transistors Q102 and Q103, which are connected together in series at a node 120. These connected transistors Q102 and Q103 are also coupled between lines D and D*. Moreover, node 120 is coupled to a cell plate 64 and a $DVC_2$ voltage generator 68 through a bleeder device 122. The $DVC_2$ voltage generator 68 transmits a cell plate signal CP of voltage $DVC_2$ to the node 120. For purposes of explaining the following embodiments of this invention, $DVC_2$ is now 2.5 volts. The bleeder device 122 is driven by a signal of voltage $V_{CCP}$, wherein $V_{CCP}$ results from having pumped $V_{CC}$ to an even higher potential.

At the beginning of a precharge cycle, digit line D and its complementary digit line D* are at different voltages as a result of a discharge of the memory cell 22 during the reading cycle. One line will have a charge equal to the $V_{CC}$ value of 5 volts, while the other line will have a 0 volt charge. The equilibrate signal EQ is then sent, activating transistor Q101, which shorts D and D* together. Moreover, the signal EQ activates transistors Q102 and Q103, which not only provide another short between D and D* but also allow the CP signal to be communicated to those lines. As a result, the lines D and D* equilibrate, both gaining a charge of potential $DVC_2$ (2.5 volts), which is the desired equilibrate voltage Veq in this example. Once the lines are equilibrated, they are ready for further testing.

Figure 7A:
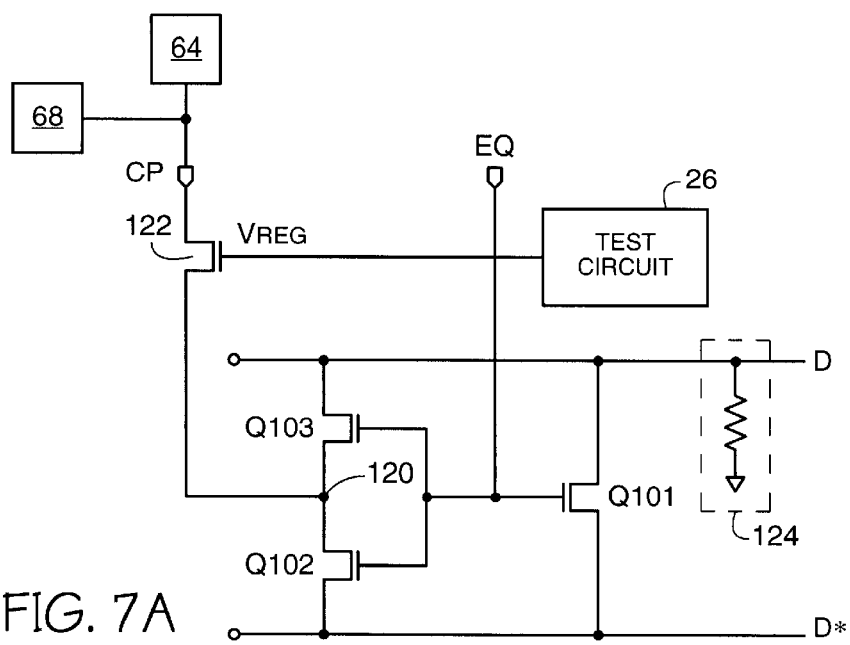
FIG. 7a is a schematic of a portion of a memory array depicting an embodiment of the current invention as used in the digit line/cell plate region of a memory array.
Figure 7B:
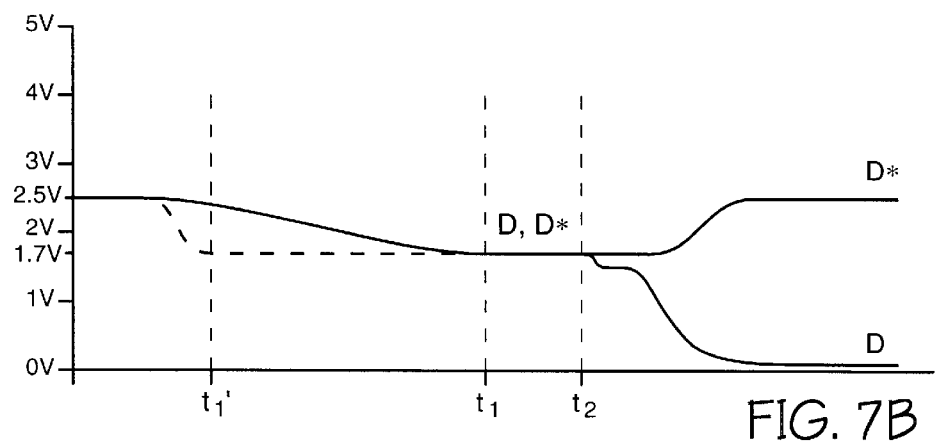
FIG. 7b is a graph illustrating the effect of the first defect and a first embodied method of the current invention.
Figure 7C:
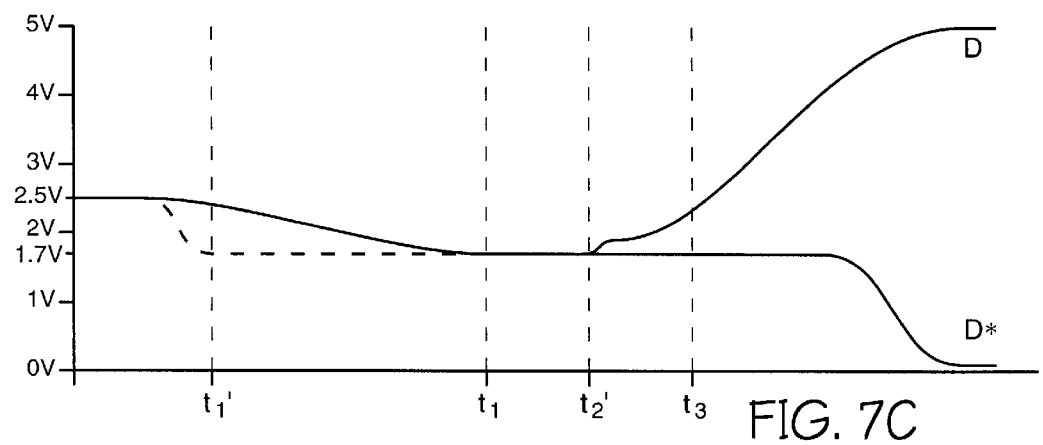
FIG. 7c is another graph illustrating the effect of the first defect and the first embodied method of the current invention.

For various reasons, a particular portion of the memory array may be defective. Hopefully, testing processes will identify those defects. As discussed above and illustrated in FIG. 7a, a first defect 124 that may exist is a short to ground of the digit line D. FIG. 7b illustrates the effect of the first defect 124. During the precharge cycle, the CP signal is trying to charge the digit lines D and D* to the 2.5 volt $DVC_2$ level and maintain that level. However, if the resistance of the short is not too great, the first defect 124 may cause the digit lines to discharge toward ground faster than CP can charge them to 2.5 volts. As a result, once the precharge process has ended at time $t_1$, the digit lines may be equilibrated at a potential lower than 2.5 volts, such as 1.7 volts. Having a Veq at a level other than $DVC_2$ makes the memory array susceptible to reading errors. For example, in the present situation illustrated in FIG. 7b, where Veq is too low, line noise on D occurring at time $t_2$ is more likely to register as a logic 0 discharge when in fact the storage cell 150 contains a logic 1 and has not yet discharged. Alternatively, assuming that a logic 1 is properly discharged and sensed at time $t_2$', a reading error is still likely: as seen in FIG. 7c, Veq may be so low due to the short that the pullup sense amp may not be able to sufficiently pull up the digit line's voltage by the time $t_3$, when external circuitry accesses line D. In order to find such a reading error, prior art requires an extended precharge time, up to time $t_1$, in order to allow the discharge from the first defect 124 to overtake the charge from CP.

The current invention, however, provides an alternative to requiring a long precharge time. FIG. 7a illustrates that the $V_{CCP}$ signal driving the bleeder device has been replaced with the test circuit 26 that applies a different voltage $V_{REG}$ to regulate the bleeder device. In the case of the first defect 124, the test circuit 26 transmits a signal having a voltage lower than $V_{CCP}$ to drive the bleeder device 122. This causes a slower charge rate and allows the discharge from the first defect 124 to quickly overtake the charging from CP, as seen by the dashed lines in FIGS. 7b and 7c. With the resulting increased disparity between the charge rate and the discharge rate, the precharge period need only endure until time $t_1$' in order to increase the likelihood of detecting an error.

The design of test circuit 26 can be the same as those used in FIGS. 4 and 5, wherein a source node 30 has access to at least one test voltage, either through a bond pad 36 or from a discrete voltage source. In this application, however, the source node 30 is coupled to the bleeder device 122. Furthermore, $V_{CCP}$ is the voltage used in non-test operations to drive the bleeder device, and $V_{CC}$ and $DVC_2$ are used to slow the charge rate. It should be further understood that the number of voltage options could be increased. Alternatively, the number of voltage options could be decreased to offer only one test voltage and one non-test voltage.

Figure 8A:
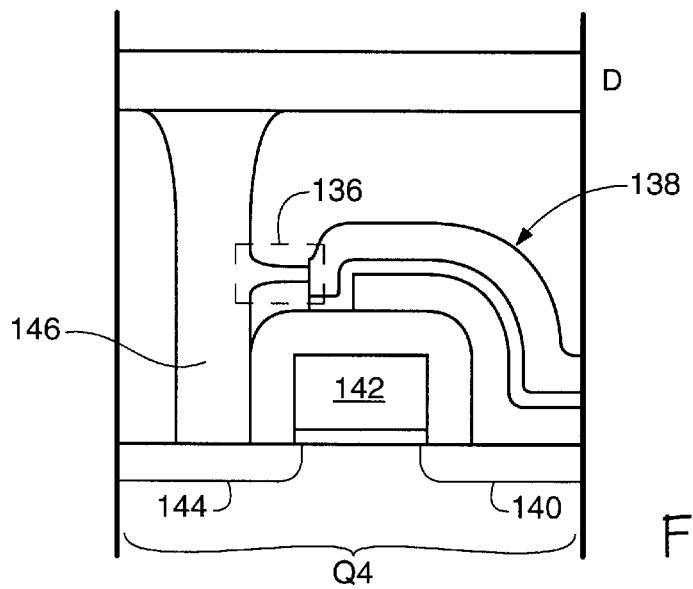
FIG. 8a depicts a cross-section of a portion of a memory array including a second type of defect.
Figure 8B:
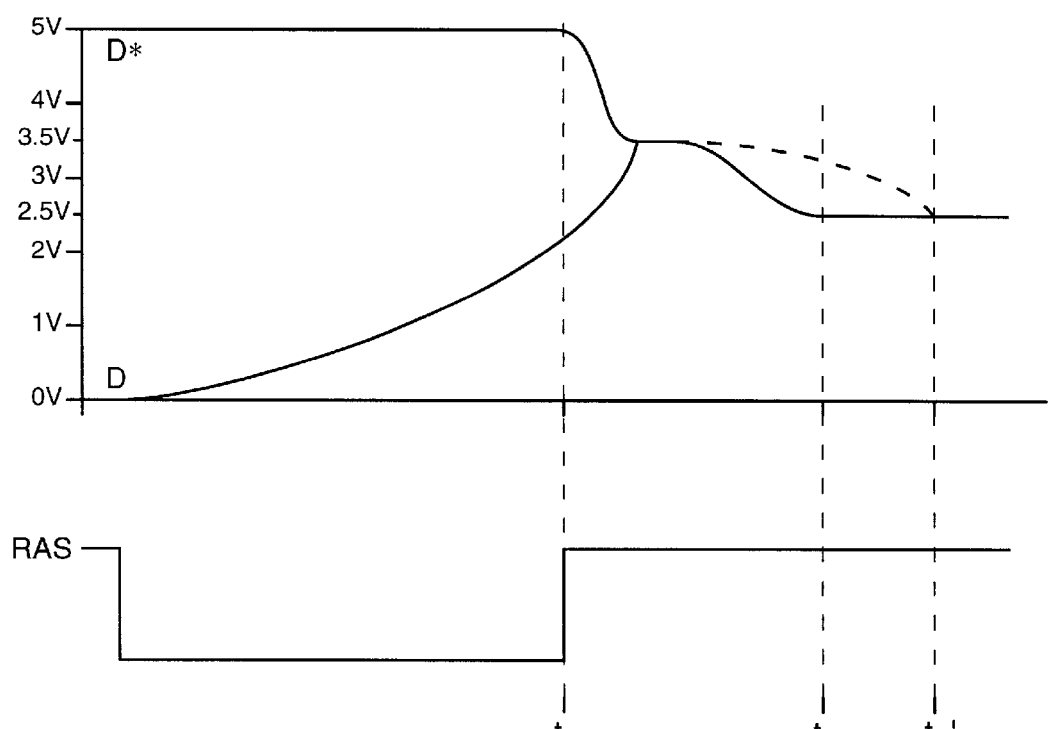
FIG. 8b demonstrates the effect on a memory array of the second type of defect as well as the effect of a second embodied method of the current invention.

These circuit embodiments, as well as others falling under the scope of the invention, have uses in detecting other defects. FIG. 8a illustrates another defect 136 that might occur within a memory array. The cross-sectional view in FIG. 8a shows the cell plate 138 coupled to a first n-region 140 of access transistor Q4. Ideally, the only way for the $DVC_2$ voltage generator 68 to charge the digit line D through the cell plate 138 is to drive the gate 142 of transistor Q4 so that the charge may pass from the first n-region 140 to a second n-region 144. From there, the charge travels through a tungsten plug 146, which serves as a contact between the second n-region 144 and the digit line D. Occasionally, however, a second defect 136 in the memory array may occur in the form of a short between the cell plate 138 and the tungsten plug 146. As discussed above, a long RAS low signal is used to detect this second defect 136. Assuming line D is charged to 0 volts, FIG. 8b shows that the long RAS signal allows line D to be charged to a higher voltage. Thus, when the low RAS signal ends at time $t_1$ and the digit lines are shorted to begin equilibration, the digit lines will no longer have an initial tendency to reach an average potential between 5 and 0 volts (2.5 volts). Rather, because line D is now higher than 0 volts, the shorted lines will settle at a higher midpoint, such as 3.5 volts. At this point, the margin between the new equilibrate voltage and the voltage representing a logic 1 has decreased. Thus, an erroneous reading is more likely, as discussed above.

Figure 8C:
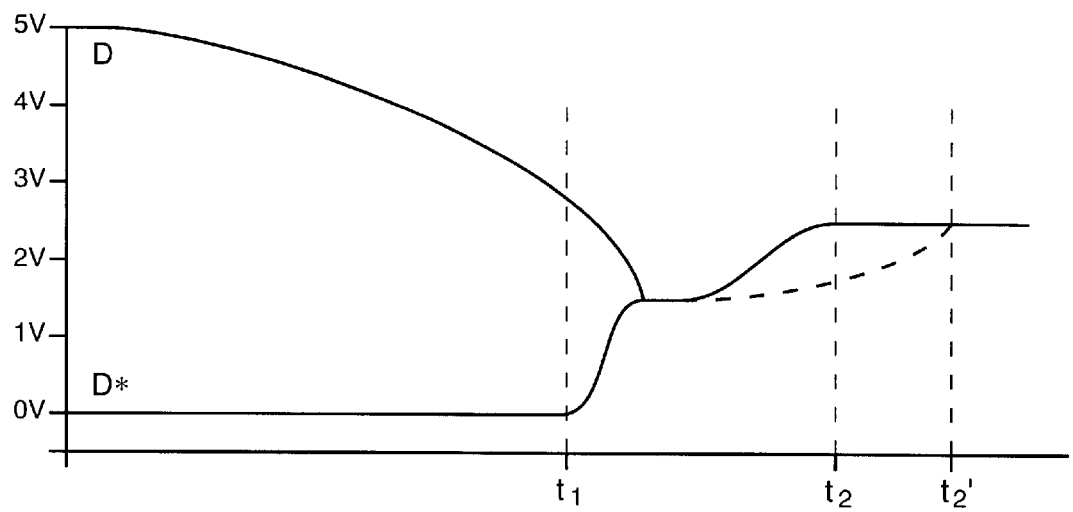
FIG. 8c further demonstrates the effect on a memory array of the second type of defect as well as the effect of a third embodied method of the current invention.
Figure 8D:
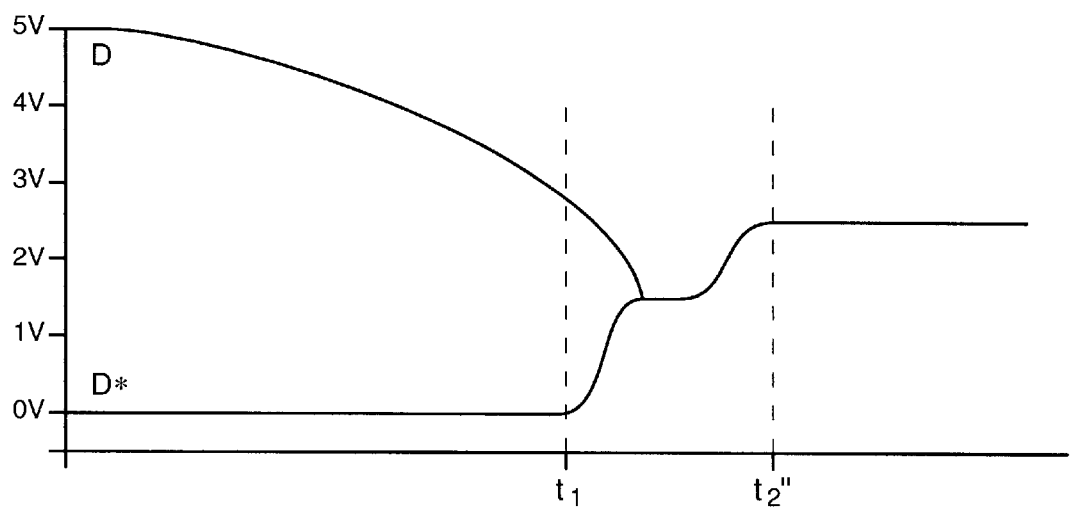
FIG. 8d depicts the effect of a fourth embodied method of the current invention as it relates to the second type of defect.

Conversely, if line D is initially charged to $V_{CC}$ (FIG. 8c), the short to the cell plate will cause D's voltage to lower during a long RAS low period. The resulting equilibrate voltage of lines D and D* could be lower than the preferred 2.5 volts. The lower equilibrate would again make an error in reading more likely. In either case, the CP signal will restore the equilibrate voltage to 2.5 volts by time $t_2$. However, by decreasing the drive to the bleeder device 122, any of the embodiments of the current invention will serve to slow down the restoration of Veq to $DVC_2$. With restoration time extended to time $t_2$', any circuit embodiment of the current invention increases the likelihood of detecting errors that would suggest the existence of the second defect 136. Alternatively, FIG. 8d shows that a circuit embodiment of the current invention could be used during a non-test mode to compensate for the second defect 136 by driving the isolation device 122 at a higher-than-normal level. As discussed above, the bleeder device 122 is normally driven at $V_{CCP}$, a voltage level representing one or two $V_t$'s above $V_{CC}$. The potential $V_t$, in turn, is the threshold voltage of the bleeder device 122. A further increase in the potential of $V_{CCP}$ would allow the bleeder device 122 to quickly restore Veq to 2.5 volts by time $t_2$". The shorter restoration period reduces the chances of an erroneous reading.

Figure 9A:
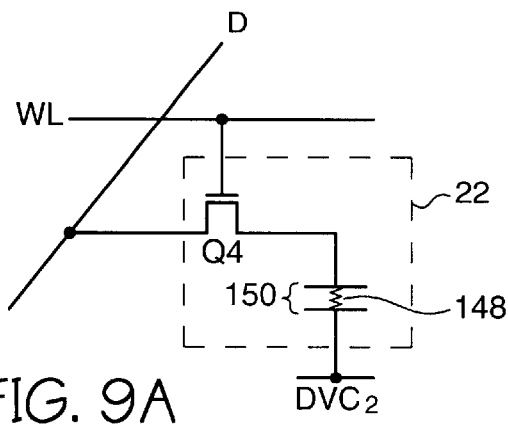
FIG. 9a is a schematic of a portion of a memory array depicting a third type of defect in said memory array.
Figure 9B:
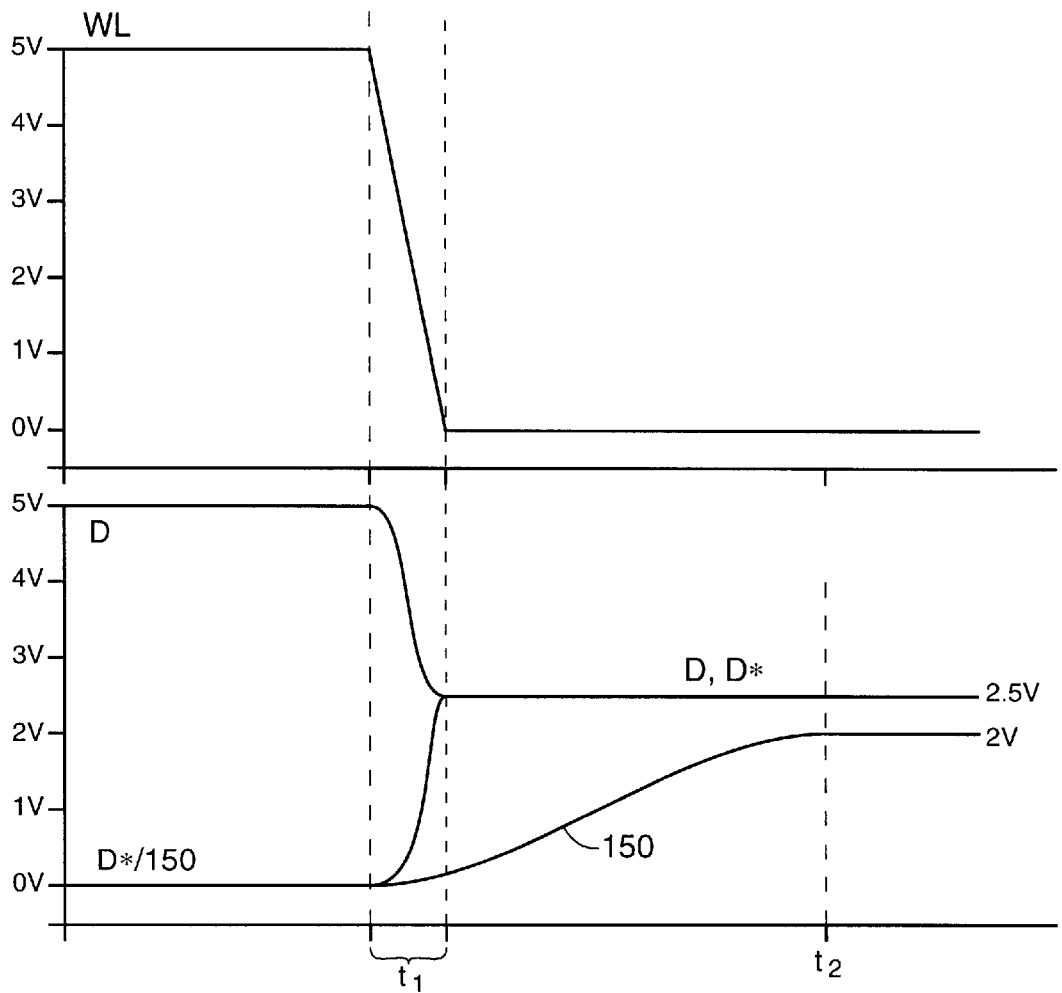
FIG. 9b is a graph indicating the effect of the third type of defect.
Figure 9C:
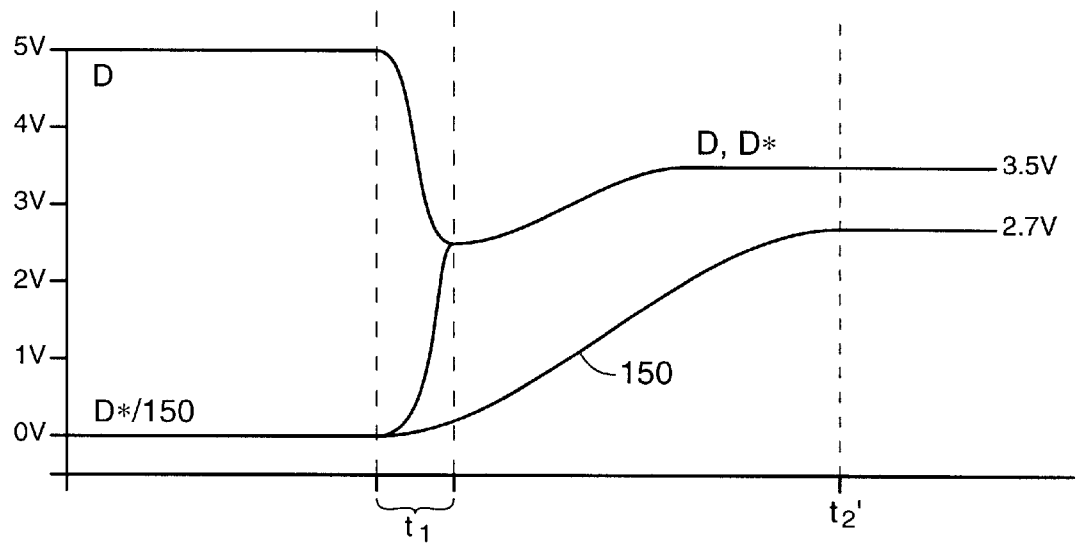
FIG. 9c is a graph illustrating a method in the prior art for detecting the third type of defect.
Figure 9D:
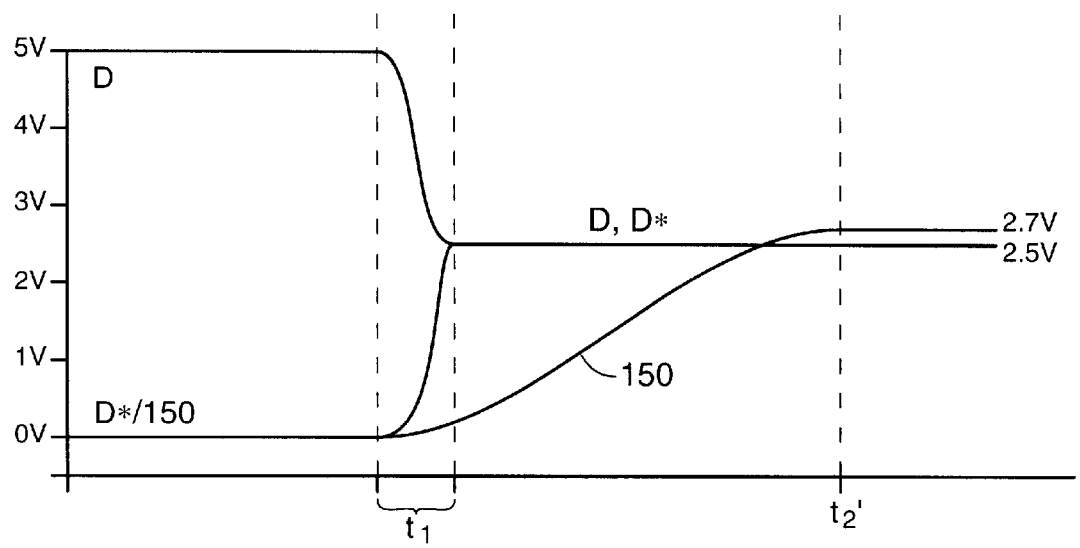
FIG. 9d is a graph illustrating the effect of a fifth embodied method of the current invention.

FIG. 9a demonstrates yet another instance wherein the current invention could shorten test time. This instance concerns a third defect 148 comprising a short that may be caused by a nitride defect within the storage capacitor 150 of a memory cell 22. It should also be noted that one of the plates of the storage capacitor 150 is in fact the cell plate 64 and is therefore connected to the $DVC_2$ generator. Given this third defect 148, FIG. 9b indicates that the CP signal, having a potential of $DVC_2$, will charge the storage capacitor 150 toward that potential even though a logic 0 has been written to that cell for test purposes. During a static refresh pause, the word line WL leading to the memory cell 22 will continuously transmit a low signal, which turns off access transistor Q4 of the memory cell 22 and allows the storage capacitor 150 to take on a greater charge. With the stored charge having a higher voltage, such as 2 volts, it is more likely that the logic 0 will be misread at line D as a logic 1. In order to speed up the leakage into the storage capacitor 150, $DVC_2$ is forced to a voltage higher than the normal 2.5 volts. Unfortunately, this would not result in much benefit under the prior art, as demonstrated by FIG. 9c: because the CP signal has a voltage of $DVC_2$ and is in communication with D and D* during the static refresh pause, the CP signal would also charge lines D and D* to a higher voltage. With the circuit embodiments of the present invention, however, a lower voltage could be used to drive the bleeder device 122 and thereby slow the charging of the digit lines, as illustrated in FIG. 9d. Thus, while D and D* are regulated to substantially remain at 2.5 volts despite the forced $DVC_2$ voltage, the storage capacitor may be quickly charged to a higher potential, such as 2.7 volts, which exceeds the equilibrate voltage and makes it very likely that a logic 1 will be mistakenly recognized.

One of ordinary skill can appreciate that, although specific embodiments of this invention have been described for purposes of illustration, various modifications can be made without departing from the spirit and scope of the invention. Concerning the invention as used with a sense amp, for example, a test circuit for the pullup sense amp could be configured to transmit an entire range of voltages through a contact pad, as done with the pulldown sense amp depicted in FIG. 4. In addition, the test circuit 26 in FIG. 6 could be used with a pulldown sense amp. Conversely, the test circuit 26 in FIG. 5 could be used with a pullup sense amp. Moreover, both of these test circuits could be coupled to the same inverter and used to test drive either type of sense amp.

Further, regarding the embodiments use with a cell plate, it should be noted that the embodiments may be applied for other testing. Any circuit embodiment, for instance, may be used during the precharge cycle discussed above in order to detect a short between a row line and a column line. Moreover, a circuit embodiment of the current invention could also be used during a non-test mode to overcome other defects in addition to the short between a digit line and cell plate, as described above.

It should also be noted that, given a particular voltage source used in an embodiment, that source can be independent of $V_{CC}$ rather than a mere alteration of $V_{CC}$, such as $V_{CCP}$ or $DVC_2$. Accordingly, the invention is not limited except as stated in the claims.

What is claimed is:

1. A method of testing a memory cell having an equilibrate voltage, a logic voltage corresponding to a logic value, and a margin representing the difference between said equilibrate voltage and said logic voltage, comprising:

enabling any defect of said memory cell to alter said margin; and reading data from said memory cell.

2. The method in claim 1, further comprising exacerbating any margin alteration from said defect.

* * * * *

UNITED STATES PATENT AND TRADEMARK OFFICE
CERTIFICATE OF CORRECTION

PATENT NO. : 6,418,071 B2
DATED : July 9, 2002
INVENTOR(S) : Beigel et al.

It is certified that error appears in the above-identified patent and that said Letters Patent is hereby corrected as shown below:

Column 10,
Line 66, add -- 138 or -- before "64".

Signed and Sealed this

Twenty-sixth Day of November, 2002

Attest:

JAMES E. ROGAN
Attesting Officer          Director of the United States Patent and Trademark Office